(12) United States Patent
Kim

(10) Patent No.: US 11,670,734 B2
(45) Date of Patent: Jun. 6, 2023

(54) SELF-POWERED SENSOR AND SENSING SYSTEM INCLUDING THE SAME

(71) Applicant: Korea Photonics Technology Institute, Gwangju (KR)

(72) Inventor: Hyo Jin Kim, Gwangju (KR)

( * ) Notice: Subject to any disclaimer, the term of this patent is extended or adjusted under 35 U.S.C. 154(b) by 0 days.

(21) Appl. No.: 17/380,683

(22) Filed: Jul. 20, 2021

(65) Prior Publication Data
US 2022/0029042 A1 Jan. 27, 2022

(30) Foreign Application Priority Data

Jul. 23, 2020 (KR) .................. 10-2020-0091469

(51) Int. Cl.
*H01L 31/153* (2006.01)
*H01L 31/109* (2006.01)
*H01L 33/00* (2010.01)
*H01L 31/0735* (2012.01)

(52) U.S. Cl.
CPC ........ *H01L 31/153* (2013.01); *H01L 31/0735* (2013.01); *H01L 31/109* (2013.01); *H01L 33/0025* (2013.01)

(58) Field of Classification Search
CPC . H01L 31/153; H01L 31/0735; H01L 31/109; H01L 31/125; H01L 33/0025; H01L 25/043; H01L 33/30; H01L 25/167; G01N 21/255; G01N 21/3504; Y02E 10/544; Y02E 10/50; Y02E 70/30; H02S 10/20; H02S 40/38
See application file for complete search history.

(56) References Cited

U.S. PATENT DOCUMENTS

| 2016/0040856 A1* | 2/2016 | Chen ...................... F21V 3/049 362/183 |
| 2022/0069025 A1* | 3/2022 | Yamazaki .............. H05B 45/20 |

FOREIGN PATENT DOCUMENTS

| KR | 10-2018-0082222 | 7/2018 |
| KR | 10-2020-0045703 | 5/2020 |

OTHER PUBLICATIONS

English Specification of 10-2018-0082222.
English Specification of 10-2020-0045703.

* cited by examiner

*Primary Examiner* — Calvin Y Choi
(74) *Attorney, Agent, or Firm* — Antonio Ha & U.S. Patent, LLC

(57) ABSTRACT

According to an embodiment, a self-powered sensor comprises at least one first layer emitting light in a preset wavelength band by receiving power from an outside, or receiving the emitted light reflected by an object, at least one second layer receiving light and generating a current, and a plurality of connectors each grown between two adjacent ones of the at least one first layer and the at least one second layer, the plurality of connectors transferring the generated current to the outside or transferring the power received from the outside to the at least one first layer and the at least one second layer.

10 Claims, 10 Drawing Sheets

SELF-POWERED SENSOR AND SENSING SYSTEM INCLUDING THE SAME

CROSS-REFERENCE TO RELATED APPLICATION(S)

This application is based on and claims priority under 35 U.S.C. 119 to Korean Patent Application No. 10-2020-0091469, filed on Jul. 23, 2020, in the Korean Intellectual Property Office, the disclosure of which is herein incorporated by reference in its entirety.

TECHNICAL FIELD

Embodiments of the disclosure relate to a sensor capable of self-generation by including a solar cell and a sensor in one structure, and a sensing system including the same.

DESCRIPTION OF RELATED ART

The description of the Discussion of Related Art section merely provides information that may be relevant to embodiments of the disclosure but should not be appreciated as necessarily constituting the prior art.

There are environmental sensors that detect various gases or components, such as methane, ammonia, ethylene or hydrogen sulfide. Such an environmental sensor emits a wavelength band of light which is not transmitted through but reflected by the target component, and senses the quantity of the light reflected by the component, thereby sensing, e.g., the concentration of the component. Infrared (IR) wavelength bands are mainly used to detect various gases or components. The environmental sensor emits an infrared wavelength band of light and measures the quantity of reflected light, thereby detecting the presence or concentration of a specific component.

Such conventional environmental sensors receive power for light radiation and reflection detection from a separate battery. Thus, inconvenience, such as use and replacement of a separate battery, occurs.

SUMMARY

According to an embodiment, there is provided a self-powered sensor having both a solar cell and a sensor in a single structure and a sensing system including the same.

According to an embodiment, a self-powered sensor comprises at least one first layer emitting light in a preset wavelength band by receiving power from an outside, or receiving the emitted light reflected by an object, at least one second layer receiving light and generating a current, and a plurality of connectors each grown between two adjacent ones of the at least one first layer and the at least one second layer, the plurality of connectors transferring the generated current to the outside or transferring the power received from the outside to the at least one first layer and the at least one second layer.

The preset wavelength band may be an infrared wavelength band.

The plurality of connectors may transmit incident light.

The at least one first layer may emit the light in different wavelength bands.

According to an embodiment, a method for manufacturing a self-powered sensor comprises a first growth step of growing a first layer and a second layer, the first layer emitting light in a preset wavelength band by receiving power from an outside, or receiving the emitted light reflected by an object, and the second layer receiving light and generating a current, a second growth step of growing a connector on each of the first layer and the second layer, and repeating the first growth step and the second growth step multiple times.

The first layer and the second layer may be grown on different substrates.

The at least one first layer and the at least one second layer may be arranged in descending order of energy band gap in a direction of incident light.

According to an embodiment, a self-powered sensor comprises at least one first layer emitting light in a mid-infrared wavelength band by receiving power from an outside, or receiving the emitted light reflected by an object, at least one second layer formed on the at least one first layer, emitting light in a near-infrared wavelength band by receiving power from the outside, or receiving the emitted light reflected by the object, at least one third layer formed on the at least one second layer and receiving light and generating a current, and a plurality of connectors each grown between two adjacent ones of the at least one first layer, the at least one second layer, and the at least one third layer, the plurality of connectors transferring the generated current to the outside or transferring the power received from the outside to the at least one first layer, the at least one second layer, and the at least one third layer.

The plurality of connectors may transmit incident light.

The at least one first layer or the at least one second layer may emit the light in different wavelength bands.

According to an embodiment, a method for manufacturing a self-powered sensor comprises a first growth step of growing a first layer, a second layer, and a third layer, the first layer emitting light in a mid-infrared wavelength band by receiving power from an outside, or receiving the emitted light reflected by an object, the second layer emitting light in a near-infrared wavelength band by receiving power from the outside, or receiving the emitted light reflected by the object, and the third layer receiving light and generating a current, a second growth step of growing a connector on each of the first layer, the second layer, and the third layer, and a repeating step of repeating the first growing step and the second growing step multiple times.

The first layer, the second layer and the third layer may be grown on different substrates.

The first layer, the second layer, and the third layer may be arranged in descending order of energy band gap in a direction of incident light.

The third layer and the connector grown on the third layer may be bonded with the second layer and the connector grown on the second layer, and the second layer and the connector grown on the second layer may be bonded with the first layer and the connector grown on the first layer.

According to an embodiment, a sensing system comprises a self-powered sensor, the self-powered sensor comprising a plurality of layers receiving light to generate current or receiving power to emit a preset wavelength band of light and a plurality of connectors each grown between two adjacent ones of the plurality of layers and transferring the generated current to an outside or transferring power from the outside to the plurality of layers, a storage battery connected with the plurality of connectors to store the current generated from the layers or transfer the power to the plurality of layers, a plurality of switches connecting the plurality of connectors with the storage battery, and a controller controlling the plurality of switches to allow the self-powered sensor to sense an object or to store the generated current in the storage battery. As described above, according to embodiments of the disclosure, a solar cell and a sensor both are included in a single structure. It is thus possible to reduce size and costs and prevent any inconvenience, such as use and replacement of a battery.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Various changes may be made to the present invention, and the present invention may come with a diversity of embodiments. Some embodiments of the present invention are shown and described in connection with the drawings. However, it should be appreciated that the present disclosure is not limited to the embodiments, and all changes and/or equivalents or replacements thereto also belong to the scope of the present disclosure. Similar reference denotations are used to refer to similar elements throughout the drawings.

The terms "first" and "second" may be used to describe various components, but the components should not be limited by the terms. The terms are used to distinguish one component from another. For example, a first component may be denoted a second component, and vice versa without departing from the scope of the present disclosure. The term "and/or" may denote a combination(s) of a plurality of related items as listed or any of the items.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when a component is "directly connected to" or "directly coupled to" another component, no other intervening components may intervene therebetween.

The terms as used herein are provided merely to describe some embodiments thereof, but not to limit the present disclosure. As used herein, the singular forms "a," "an," and "the" are intended to include the plural forms as well, unless the context clearly indicates otherwise. As used herein, the term "comprise," "include," or "have" should be appreciated not to preclude the presence or addability of features, numbers, steps, operations, components, parts, or combinations thereof as set forth herein.

Unless otherwise defined, all terms including technical and scientific terms used herein have the same meaning as commonly understood by one of ordinary skill in the art to which the embodiments of the present disclosure belong.

It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The components, processes, steps, or methods according to embodiments of the disclosure may be shared as long as they do not technically conflict with each other.

Figure 1:
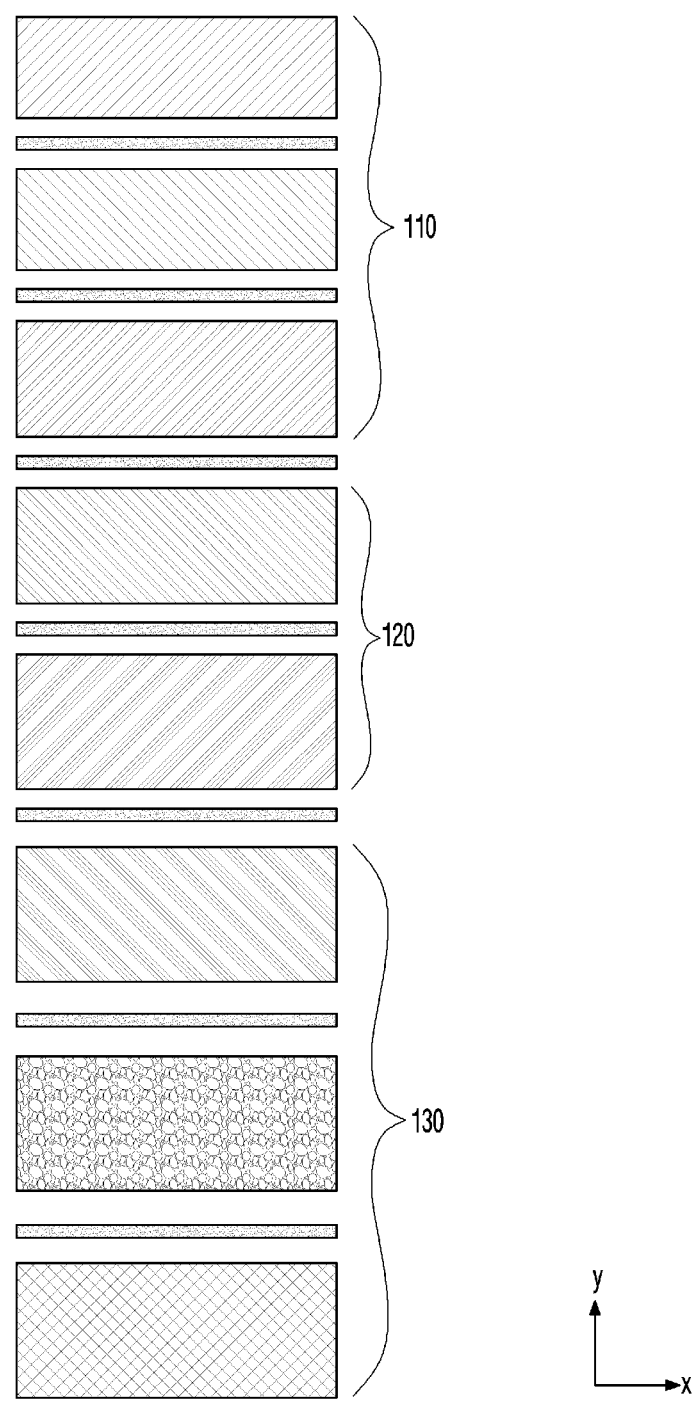
FIG. 1 is a cross-sectional view schematically illustrating a structure of a self-powered sensor according to an embodiment of the disclosure.

FIG. 1 is a cross-sectional view schematically illustrating a structure of a self-powered sensor according to an embodiment of the disclosure.

Referring to FIG. 1, a self-generation sensor 100 includes a first layer group 110, a second layer group 120, and a third layer group 130.

The first layer group 110 receives incident light and converts light energy into electrical energy. The first layer group 110 may be formed of a gallium indium phosphide (GaInP)-based compound, a gallium phosphide (GaP)-based compound, or a gallium arsenide (GaAs)-based compound. The first layer group 110 is implemented with such a compound, and serves as a solar cell that receives light incident on the first layer group 110 and generates electrical energy. The wavelength band of the absorbed light differs depending on the type of the compound. To absorb various wavelength bands of incident light, the first layer group 110 may be formed of various compounds, and a plurality thereof are stacked one over another.

The second layer group 120 receives the light transmitted through the first layer group 110 and converts light energy into electrical energy, or receives power and emits light in a near-infrared wavelength band. The second layer group 120 may be formed of a gallium arsenide phosphide (GaAsP)-based compound or an indium gallium arsenide (InGaAs)-based compound. The second layer group 120 serves as a solar cell that receives light in a relatively long wavelength band, which has been transmitted through the first layer group 110, and generates electrical energy. Meanwhile, when power is applied to the second layer group 120, the second layer group 120 emits light of a near-infrared (NIR) wavelength band, which ranges from 1100 nm to 1800 nm, to the outside. The light emitted from the second layer group 120 passes through the first layer group 110 to the outside, and is used to detect an object existing in a specific area. When an object exists within the specific area, a near-infrared wavelength band of light emitted to the outside is reflected by the object. The presence or absence of the object may be sensed based on whether the reflected light is incident on the second layer group 120 and is sensed.

The third layer group 130 receives power and emits light in a mid-infrared wavelength band, or receives light in the mid-infrared wavelength band to detect an object. The third layer group 130 may be formed of an indium arsenide antimonide (InAsSb)-based compound or an indium antimonide (InSb)-based compound. The third layer group 130 receives power and emits light in a mid-infrared (MIR) wavelength band ranging from 1600 nm to 8000 nm to the outside. The light emitted from the third layer group 130 is transmitted through the first layer group 110 and the second layer group 120 to the outside, and is used to detect an object existing in a specific area. When an object exists in the specific area, the mid-infrared wavelength band of light emitted to the outside is reflected by the object. The presence or absence of the object may be sensed based on whether the reflected light is incident on the third layer group 130 and is sensed.

Here, the object, i.e., detection target, may be any type of object that does not absorb but reflects light in an infrared wavelength band. For example, the detection target may be various gases or components, such as methane, ammonia, ethylene, or hydrogen sulfide, or a specific object, animal, or a person.

The self-powered sensor 100 includes both a layer serving as a solar cell and a sensor sensing the presence or concentration of an object by emitting light and then sensing light reflected. Accordingly, the self-powered sensor 100 may sense an object by generating power by itself without the need for a separate battery to supply power to the sensor. Further, since the self-powered sensor 100 emits both a near-infrared wavelength band of light and a mid-infrared wavelength band of light and senses an object and may thus simultaneously or sequentially sense various objects.

The layer groups 110 to 130 are arranged in descending order of energy band gap along the direction (−y axis) of incident light. Each layer in the layers 110 to 130 has a different energy band gap depending on the type of the compound. The layer with the larger energy band gap absorbs or emits a shorter wavelength band of light, and the layer with the smaller energy band gap absorbs or emits a longer wavelength band of light. In this case, when incident onto the layer, a longer wavelength of light than the energy band gap of the layer passes through the layer, but a shorter wavelength of light than the energy band gap of the layer is absorbed by the layer. When a layer with a smaller energy band gap is placed at the top in the direction in which the light is incident, the light in wavelength bands shorter than the energy band gap of the layer is absorbed by the layer, so that the layer placed under the layer may not receive the light. To address this issue, the layers in the layer groups 110 to 130 are arranged in descending order of energy band gap along the direction (−y axis) of incident light, e.g., the layer with the larger energy band gap is positioned higher than the layer with the smaller energy band gap. Thus, each layer may sequentially receive the light that has passed through the layer positioned thereabove, e.g., along the +y axis direction.

Figure 2:
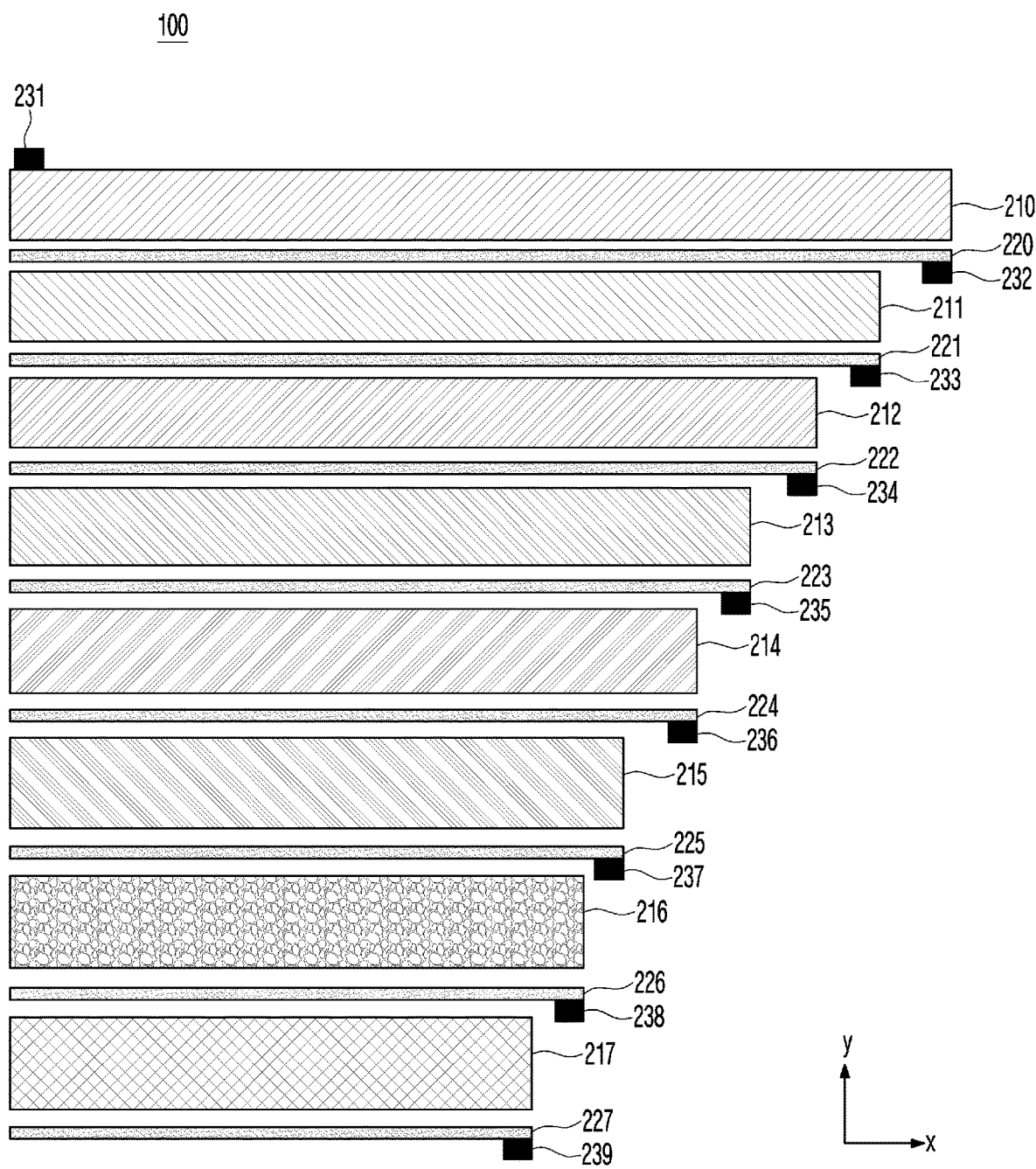
FIG. 2 is a cross-sectional view illustrating a detailed structure of a self-powered sensor according to an embodiment of the disclosure.
Figure 3:
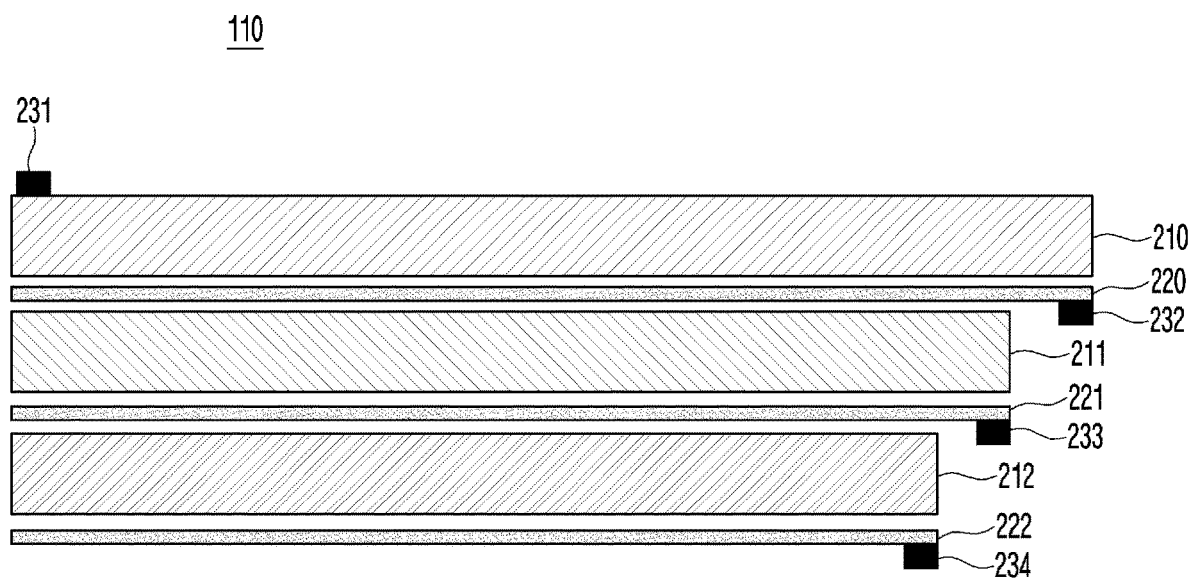
FIG. 3 is a cross-sectional view illustrating a first layer group in a self-powered sensor according to an embodiment of the disclosure.
Figure 4:
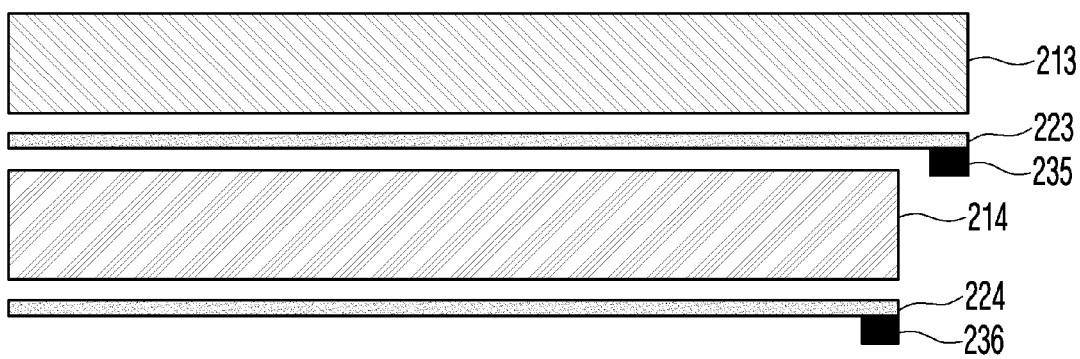
FIG. 4 is a cross-sectional view illustrating a second layer group in a self-powered sensor according to an embodiment of the disclosure.
Figure 5:
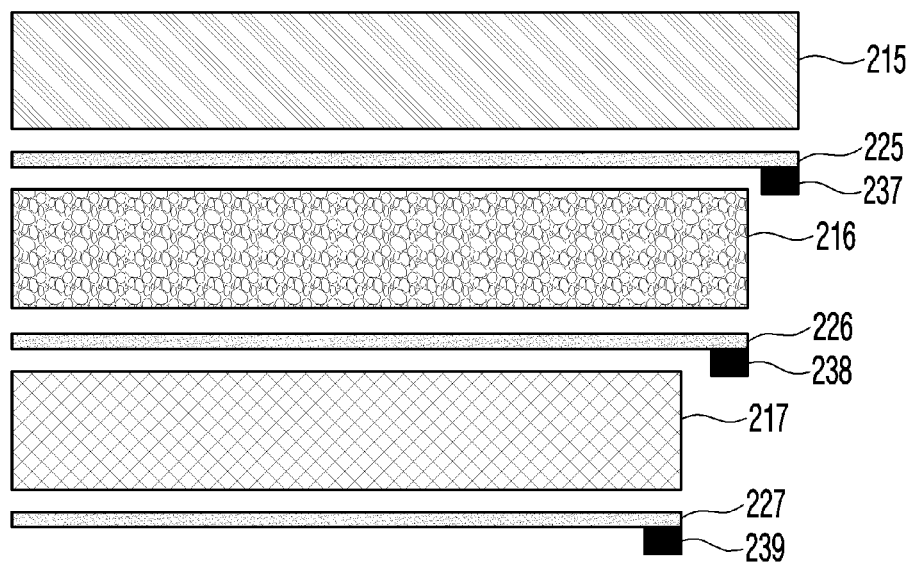
FIG. 5 is a cross-sectional view illustrating a third layer group in a self-powered sensor according to an embodiment of the disclosure.

FIG. 2 is a cross-sectional view illustrating a detailed structure of a self-powered sensor according to an embodiment of the disclosure. FIG. 3 is a cross-sectional view illustrating a first layer group in a self-powered sensor according to an embodiment of the disclosure. FIG. 4 is a cross-sectional view illustrating a second layer group in a self-powered sensor according to an embodiment of the disclosure. FIG. 5 is a cross-sectional view illustrating a third layer group in a self-powered sensor according to an embodiment of the disclosure.

Referring to FIG. 2, according to an embodiment, a self-powered sensor 100 includes layers 210, 211, 212, 213, 214, 215, 216, and 217, connectors 220, 221, 222, 223, 224, 225, 226, and 227, and electrodes 231, 232, 233, 234, 235, 236, 237, 238, and 239.

The layers 210 to 217 are formed of various compounds to receive optical energy and generate electrical energy or to emit light in a specific wavelength band and sense reflected light. As described above with reference to FIG. 1, the layers 210 to 217 are divided into the first layer group 110, the second layer group 120, and the third layer group 130 according to operation characteristics.

Each of the connectors 220 to 227 is disposed between two adjacent ones of the layers 210 to 217, and transfers power to the layers or receives electrical energy generated from the layers. Each connector 220 to 227 is formed of a compound similar to its adjacent layer 210 to 217. The connectors 220 to 227 may be sequentially grown with the layers without passing through a separate process, e.g., separate deposition, and are formed in a single process and disposed in such a manner that each connector is positioned between two adjacent ones of the layers 210 to 217

Each connector 220 to 227 is formed of a compound similar to that of its adjacent layer. Thus, like the layers, each connector 220 to 227 may also transmit the incoming light depending on the wavelength and transfer the light to the layer positioned thereunder.

Figure 8:
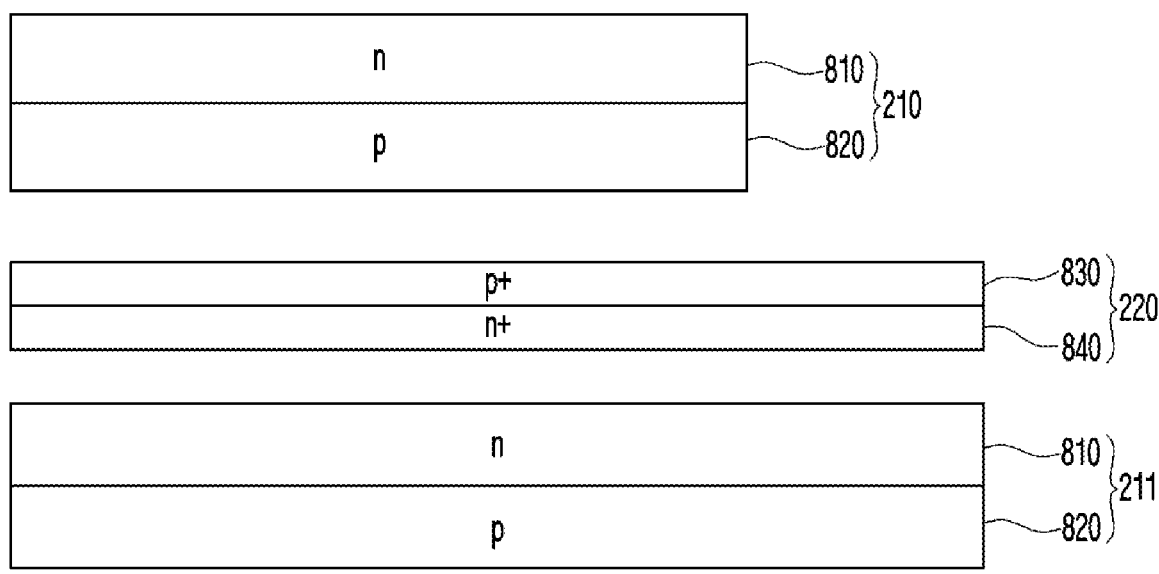
FIG. 8 is a view illustrating a structure of layers and a connector in a self-powered sensor according to an embodiment of the disclosure.

Each connector 220 to 227 is formed between two adjacent layers to transfer power received through its corresponding electrode 231 to 239 (e.g., the electrode connected thereto) to its adjacent layer or to transfer electric energy generated from its adjacent layer through its corresponding electrode 231 to 239 (e.g., the electrode connected thereto) to the outside. As shown in FIG. 8, each connector 220 to 227 may be formed of a tunnel junction. This is described below in detail with reference to FIG. 8.

FIG. 8 is a view illustrating a structure of layers and a connector in a self-powered sensor according to an embodiment of the disclosure. Although FIG. 8 illustrates the connector 220 formed between the layer 210 and the layer 211, this is merely an example, and the other connectors and layers may also have substantially the same structure.

The layer 210 and the layer 211 each may include an n-type semiconductor 810 in an upper portion thereof and a p-type semiconductor 820 under the n-type semiconductor 810.

In this case, an upper end 830 of the connector 220 formed of a high-doped p-type semiconductor is disposed adjacent to the lower portion 820 of the layer 210 formed of the p-type semiconductor. A lower end 840 of the connector 220 formed of high-doped n-type semiconductor is disposed adjacent to the upper portion 810 of the layer 211 formed of the n-type semiconductor.

As such, the connector is implemented as a tunnel junction and may thus advantageously be grown along with its adjacent layer. For example, if the connectors are implemented in a configuration other than the tunnel junction, a separate process (e.g., deposition) other than the growth of layers is required to form the connectors, rendering the process complicated. However, according to an embodiment of the disclosure, as the connectors are implemented in the tunnel junction structure, such issue may be addressed.

Although FIG. 8 illustrates an example in which the upper portion of the layer is formed of an n-type semiconductor and the lower portion of the layer is formed of a p-type semiconductor, the opposite case may stand. For example, the upper portion of the layer is formed of a p-type semiconductor and the lower portion of the layer is formed of an n-type semiconductor. For example, the connector may be composed of an upper portion including a high-doped n-type semiconductor and a lower portion including a high-doped p-type semiconductor.

Referring back to FIG. 2, each electrodes 231 to 239 may be disposed on one exposed surface of its corresponding layer or connector 220 to 227 to transfer power to the layer or connector or to transfer electric energy from the layer or connector to the outside. Since the first layer group 110 generates electric energy using incoming optical energy, the generated electric energy is transferred to the outside using electrodes 231 and 234 connected to the outside (e.g., an external storage battery described below with reference to FIG. 9). Since the second layer group 120 and the third layer group 130 each emit light in a preset wavelength band, the second and third layer groups 120 and 130 may receive power from the outside using various electrodes connected to the outside. For example, if the electrode 234 and the electrode 235 are connected to the outside, only the fourth layer 213 receives power, emits light in a near-infrared wavelength band, generates electric energy using the reflected light, and transfers the electric energy to a controller which is described below with reference to FIG. 9. As another example, when the electrode 236 and the electrode 239 are connected to the outside, the sixth to eighth layers 215 to 217 (i.e., the entire third layer group) emit light in a mid-infrared wavelength band and transfers information (electric energy) sensed by receiving the reflected light to the outside.

Referring to FIG. 3, the first layer group 110 includes the first layer 210, the second layer 211, and the third layer 212, and are positioned at the top of the self-powered sensor 100 so that incoming light is first incident on the first layer group 110. The first layer group 110 absorbs light in relatively short wavelength bands. The first layer 210 may be formed of aluminum gallium indium phosphide (AlGaInP), the second layer 211 disposed under the first layer 210 may be formed of indium gallium phosphide (InGaP), and the third layer 212, which is the lowermost layer in the first layer group, may be formed of gallium arsenide (GaAs). However, since the layers in the first layer group have a relatively large energy bandgap, the layers in the first layer gap are formed to be longer than the layers in the other layer groups 120 and 130 to increase produced electric energy (e.g., voltage). As such, since the layers in the first layer group are relatively longer, they may produce more electric energy.

Connectors 220, 221, and 222 are disposed between the layers 210 to 212, and electrodes 231, 232, 233, and 234 are disposed on the surface of the first layer and the surfaces of the connectors. The connectors 220, 221, and 222 are formed of compounds similar to those of their adjacent layers 210, 211, and 212 and are thus sequentially grown with the layers without undergoing a separate process, e.g., separate deposition. To form electrodes on the surfaces of the connectors 220, 221, and 222, the respective ends of the second layer 211, the third layer 212, the connector 221 between the second and third layers 211 and 212, and the connector 222 disposed under the third layer 212 are etched out. The lower layer, and lower connector, may be etched out in a larger width, so that electrodes may be disposed on the respective surfaces of the connectors.

Referring to FIG. 4, the second layer group 120 includes the fourth layer 213 and the fifth layer 214 and is disposed under the first layer group 110 and absorbs or emits light in relatively long wavelength bands. The fourth layer 213 may be formed of indium gallium arsenide phosphide (InGaAsP), and the fifth layer 214 may be formed of indium gallium arsenide (InGaAs). The fourth and fifth layers may absorb the light of a relatively long wavelength band that has passed through the first layer group 110 and produce electrical energy. Accordingly, if the electrode 236 disposed on the lowermost connector 224 of the fifth layer 214, together with the electrode 231 in the first layer group 110, is connected with the outside, the electric energy produced from the first layer group 110 and the second layer group 120 is transferred to the outside. Etching is performed on the respective side ends of the layers and connectors in the second layer group 120 in substantially the same manner performed on the second layer group 110.

When the electrode 235 and the electrode 236 are connected with the outside and receive power, the fourth and fifth layers 213 and 214 receive the power through the connectors 223 and 224 and emit light in a near-infrared wavelength band. The connection between the electrodes and the outside is controlled by a controller, as described below, and is performed typically during a time period when sunlight is not incident. The fourth layer 213 emits near-infrared light in a relatively short wavelength ranging from 1100 nm to 1300 nm, and the fifth layer 214 emits near-infrared light in a relatively long wavelength ranging from 1300 nm to 1800 nm. When the electrode 234 and the electrode 235 are connected with the outside to receive power, only the fourth layer 213 emits light. When the electrode 235 and the electrode 236 are connected with the outside to receive power, only the fifth layer 214 emits light. When the electrode 234 and the electrode 236 are connected with the outside to receive power, both the fourth layer 213 and the fifth layer 214 emit light so that the light in nearly the entire near-infrared wavelength band is emitted from the fourth layer 213 and the fifth layer 214.

When the light in the near-infrared wavelength band is irradiated to and reflected by an object, the fourth layer 213 and/or the fifth layer 214 receives the reflected light. As described above, the fourth layer 213 and/or the fifth layer 214 emit light during a time period in which sunlight is not incident on the self-powered sensor 100. Thus, it is the reflected light, not the sunlight, that is incident on the fourth layer 213 and/or the fifth layer 214. The presence of reflected light means that an object to be sensed exists in the area to which the light is irradiated. The fourth layer 213 and/or the fifth layer 214 generate electrical energy from the reflected light, and the controller (to be described below) determines whether electrical energy is generated from each layer and the amount of generated energy to thereby detect or determine the existence and concentration of the object.

Referring to FIG. 5, the third layer group 130 includes the sixth layer 215, the seventh layer 216, and the eighth layer 217 and is positioned under the second layer group and emit light in a relatively long wavelength band to/from the outside. The sixth layer 215 may be formed of gallium indium arsenide antimonide (GaInAsSb), the seventh layer 216 may be formed of indium arsenide antimonide phosphide (InAsSbP), and the eighth layer 217 may be formed of indium antimonide (InSb). When power is supplied to each layer, the sixth to eighth layers 215 to 217 emit light in mid-infrared wavelength bands. The sixth layer 215 emits mid-infrared light in a relatively short wavelength band ranging from 1600 nm to 2400 nm. The seventh layer 216 emits mid-infrared light in a relatively long wavelength band ranging from 2400 nm to 4600 nm. The eighth layer 217 emits mid-infrared light in a long wavelength band of 4600 nm or more. Each layer in the third layer group 130 operates in a similar manner to the layers in the second layer group 120. The electrodes 237, 238, and 239 are connected with the outside to receive power so that mid-infrared light in a specific wavelength band or mid-infrared light in the entire mid-infrared wavelength band may be emitted. Etching is performed on the respective side ends of the layers and connectors in the third layer group 130 in substantially the same manner performed on the second layer group 110.

Similar to the layers in the second layer group 120, each layer in the third layer group 130 receives reflected light to generate electrical energy during a time period when sunlight is not incident on the self-powered sensor 100. The controller (to be described below) detects or determines the presence and concentration of an object by determining whether electrical energy is generated from each layer and the amount of generated energy.

Figure 6:
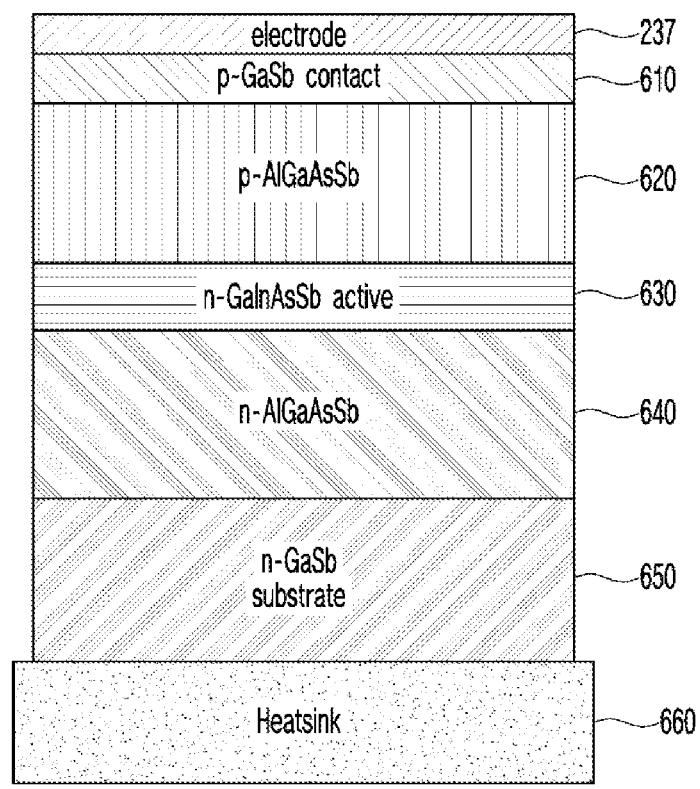
FIG. 6 is a cross-sectional view illustrating a structure of a layer according to an embodiment of the disclosure.
Figure 7:
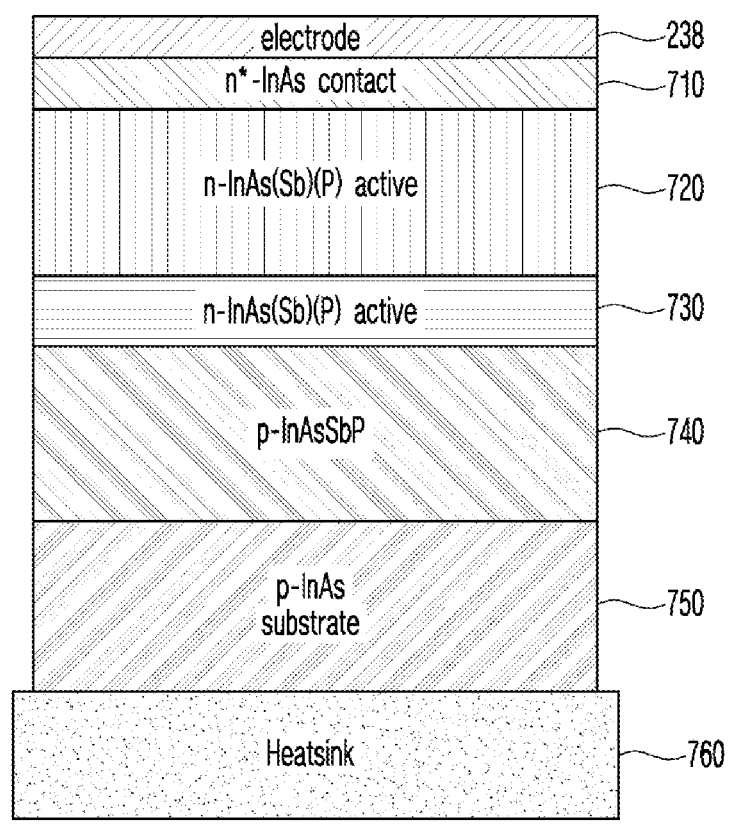
FIG. 7 is a cross-sectional view illustrating a structure of another layer according to an embodiment of the disclosure.

FIG. 6 is a cross-sectional view illustrating a structure of a layer according to an embodiment of the disclosure. FIG. 7 is a cross-sectional view illustrating a structure of another layer according to an embodiment of the disclosure. Although FIG. 6 illustrates a structure of the sixth layer 215 and FIG. 7 illustrates a structure of the seventh layer 216, embodiments of the disclosure are not limited thereto. A layer, which emits light, e.g., each layer in the second layer group 120 or each layer in the third layer group 130, may be implemented with the structure illustrated in FIG. 6 or the structure illustrated in FIG. 7.

Referring to FIG. 6, the layer 215 includes a heat sink 660 for absorbing heat at the bottom, an n semiconductor layer 640 (or 640 and 650) formed on the heat sink 660, a p semiconductor layer 620 (or 610 and 620) formed on the n semiconductor layer 640 (or 640 and 650), and an active layer 630 formed between the n and p semiconductor layers. Each of the semiconductor layers 620 and 640 may have a different material depending on the material for forming the layer.

Referring to FIG. 7, a p-type semiconductor layer 740 (or 740 and 750) may be formed on a heat sink 760, unlike FIG. 6, and an active layer 730 and an n-type semiconductor layer 720 (or 710 and 720) may be sequentially formed thereon.

Holes and electrons formed in each semiconductor layer may be combined in the active layer, so that light may be emitted to the outside. On the other hand, when reflected light is incident, holes or electrons may be formed in each semiconductor layer so that electrical energy is transmitted to the outside.

To grow in the same growth process, the layers need to have the same or similar lattice structures. The layers in the same layer group have the same or similar lattice structures while the layers in different layer groups have different lattice structures. Accordingly, the layer groups are combined together by a bonding method or a grading layer-forming method. In the bonding method, each layer group is grown on a substrate with the same lattice constant as the layer group, and so-grown layer groups are bonded together, with the substrates of the layer groups having the smaller energy band gaps removed. Thus, the final bonded structure of the layer groups are left only with the substrate having the larger energy band gap. In the grading layer-forming method, all the layer groups are simultaneously grown on the same substrate as that of the layer group with the largest energy band gap. Growth proceeds from the layer group having the larger energy band gap to the layer group having the lower energy band gap, and growth in the opposite direction cannot be performed. To prevent a sharp change in lattice constant, grading layers, which gradually change in lattice constant, each is grown between two layer groups with different lattice constants, connecting the two layer groups.

In growing the layers, a layer having the largest energy band gap in each layer group, i.e., the layer 210 in the first layer group, the layer 213 in the second layer group, and the layer 215 in the third layer group, is first grown on, e.g., a gallium arsenide (GaAs) substrate, and then, a connector and a layer with a smaller energy band gap, are sequentially grown thereon. In typical layer growth, it is advantageous to grow layers in the order from the largest energy band gap to the smallest energy band gap.

In this case, each layer and the connector adjacent thereto are subjected to an etching process before or after bonding. The etching process is performed to expose a portion of the connector adjacent to the particular layer to the outside so that an electrode may be disposed on the portion of the connector. As such, to allow the portion of each connector, where an electrode is to be disposed to be exposed to the outside, each layer and its connector undergo an etching process. The lower layer, in the direction of −y axis, and its connector may be etched more, and the upper layer and its connector may be etched relatively less. Thus, the connector adjacent to each layer has a portion that is exposed to the outside and allows an electrode to be disposed thereon.

Figure 9:
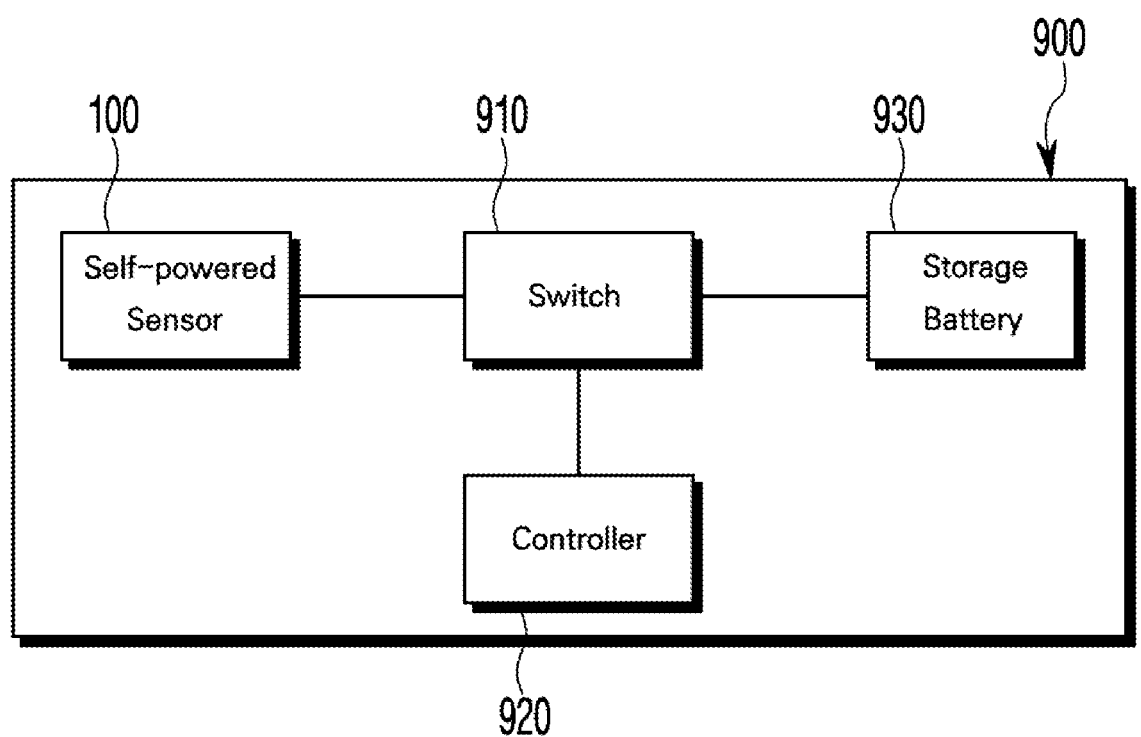
FIG. 9 is a view illustrating a configuration of a sensing system according to an embodiment of the disclosure.

FIG. 9 is a view illustrating a configuration of a sensing system according to an embodiment of the disclosure.

Referring to FIG. 9, according to an embodiment, a sensing system 900 includes a self-powered sensor 100 (e.g., a self-powered infrared (IR) sensor), a switch 910, a controller 920, and a storage battery 930.

As described above in connection with FIGS. 1 to 8, the self-powered sensor 100 absorbs light to generate electric energy or senses an object using a preset wavelength band of light. The self-powered sensor 100 may be connected with the storage battery 930 via the electrode disposed on each connector to receive power or to transfer generated electric energy.

The switch 910 controls the connection between the electrode disposed on each connector of the self-powered sensor 100 and the storage battery 930 under the control of the controller 920. There may be provided a plurality of switches 910.

The controller 920 controls the connection of the switch 910 based on whether the amount of the light incident on the self-powered sensor 100 is a preset reference value or more. The controller 920 may determine whether to allow the self-powered sensor 100 to perform charging or to emit what wavelength band of light depending on which connector's electrode is controlled to connect to the storage battery 930. For example, when the controller 920 connects the electrode 231 and the electrode 236 to the storage battery 930, the self-powered sensor 100 generates electric energy using optical energy and stores the generated electric energy in the storage battery 930. When the controller 920 connects the electrode 237 and the electrode 239 to the storage battery 930, the self-powered sensor 100 emits light in a mid-infrared wavelength band and transfers the electric energy generated by reflected light to the controller 920. The controller 920 may have a separate sensor to determine whether the amount of light incident on the self-powered sensor 100 is a preset reference value or more, or the controller 920 may make such determination in an indirect manner as follows. The controller 920 may indirectly determine the amount of the light incident on the self-powered sensor 100 based on the current time, the amount of electricity (or electric energy) charged to the storage battery 930, or the amount of electricity (or electric energy) charged to the self-powered sensor 100. For example, based on the current time, the controller 920 may determine that a sufficient amount of light may be introduced into the self-powered sensor 100 typically during a morning or afternoon time period. When the amount of electricity (or electric energy) stored in the storage battery 930 is a reference value or less, the controller 920 may determine that there has been continuous light emission, and thus the amount of light to be introduced into the self-powered sensor 100 will increase soon. When the amount of electricity (or electric energy) charged to the self-powered sensor 100 is a predetermined reference value or more, the controller 920 may determine that the amount of light introduced into the self-powered sensor 100 is large.

The controller 920 may determine whether the current time is within a preset time period to thereby control the connection of the switch 910. The preset time period may be a morning and afternoon time period during which the amount of the light incident onto the self-powered sensor 100. When the current time is within the preset time period, the controller 920 controls the switch 910 to connect the first layer group 110 and/or the second layer group 120 and the storage battery 930, so that the storage battery 930 receives and stores the electric energy generated from the layer group. If the current time is not within the preset time period, the controller 920 controls the switch to connect the second layer group 120 and/or the third layer group 130 and the storage battery 930, so that the layer group emits light in a near-infrared wavelength band and/or mid-infrared wavelength band.

The controller 920 may determine whether the amount of electricity (or electric energy) charged to the self-powered sensor is the preset reference value or more or whether the amount of electricity (or electric energy) stored in the storage battery 930 is the preset reference value or lower, thereby controlling the connection of the switch 910. When the amount of electricity (or electric energy) charged to the self-powered sensor 100 is the preset reference value or more or the amount of electricity (or electric energy) stored in the storage battery 930 is the preset reference value or less, the controller 920 may determine that the self-powered sensor 100 needs to generate electric energy and store the electric energy in the storage battery 930. In contrast, when the amount of electricity (or electric energy) charged to the self-powered sensor 100 is the preset reference value or less or the amount of electricity (or electric energy) stored in the storage battery 930 is the preset reference value or more, the controller 920 may determine that the self-powered sensor 100 needs to emit a specific wavelength band of light. In such cases, the controller 920 may control to connect the storage battery 930 with the switch for generating electric energy and charging the storage battery 930 with the generated electric energy or the switch for receiving power and emitting a specific wavelength band of light.

The controller 920 senses the presence and concentration of an object, using electric energy generated by the second layer group 120 and/or the third layer group 130 receiving reflected light. If an object is present in the area where an infrared wavelength band of light is irradiated, reflected light occurs and, as the concentration (or amount) of the object increases, the amount of the reflected light increases. Thus, the controller 920 determines whether electric energy is generated from the second layer group 120 and/or third layer group 130 according to reception of the reflected light and, if generated, the amount of generated electric energy, thereby sensing the presence and concentration of an object.

The storage battery 930 receives and stores electric energy generated from the self-powered sensor 100 or provides power to the self-powered sensor 100. If connected with the first layer group and/or the second layer group, which generates electric energy, in the self-powered sensor 100 under the control of the controller 920, the storage battery 930 receives and stores the electric energy generated from the layer group. Conversely, if connected with the second layer group 120 and/or the third layer group 130 in the self-powered sensor 100 under the control of the controller 920, the storage battery 930 supplies stored electric energy to the layer group, allowing the layer to emit a predetermined wavelength band of light. As such, as the battery 930 stores the generated electric energy, the self-powered sensor 100 may be operated without receiving necessary energy from the outside or by receiving a minimum amount of energy needed.

Figure 10:
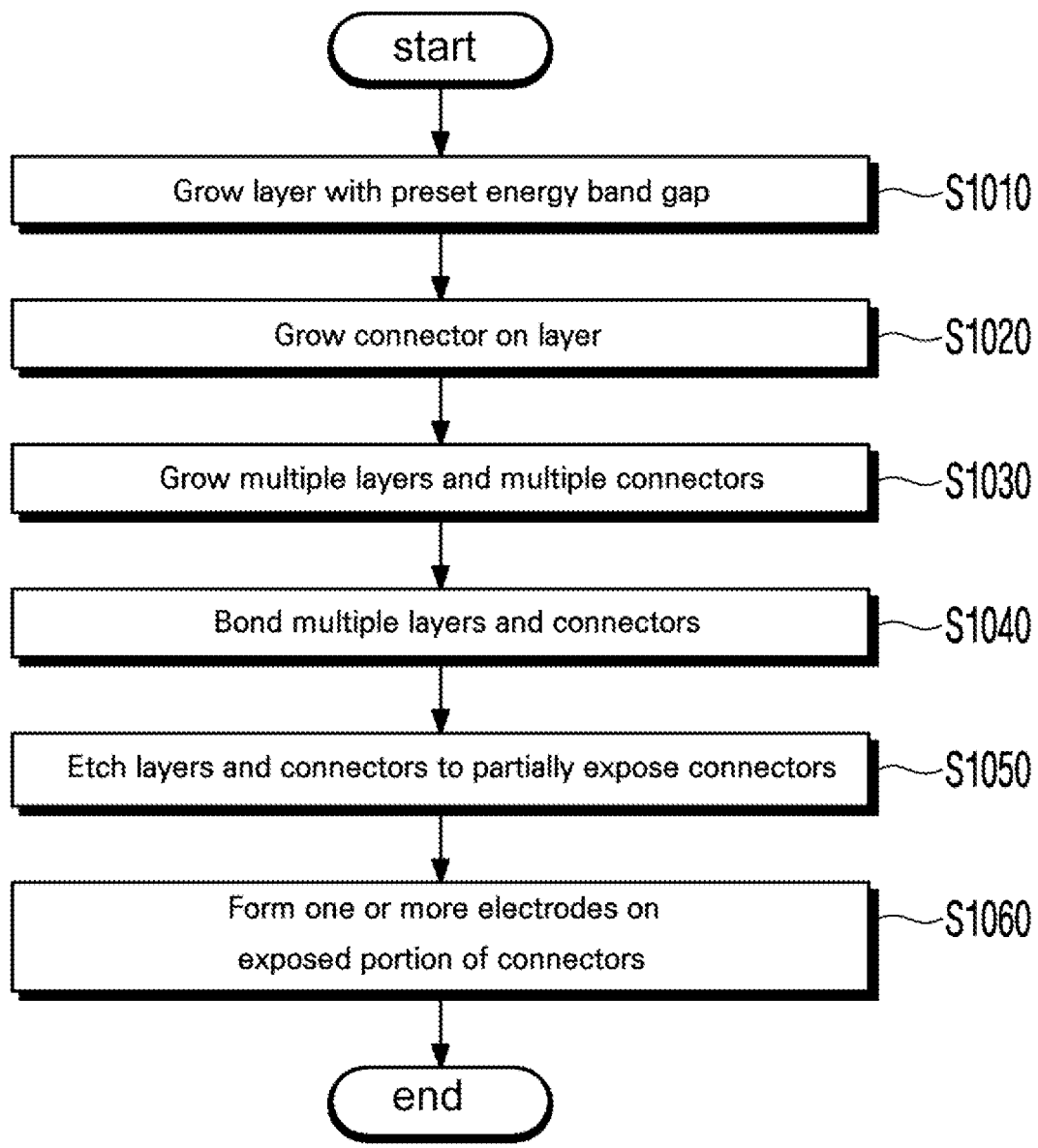
FIG. 10 is a flowchart illustrating a method for manufacturing a self-powered sensor according to an embodiment of the disclosure.

FIG. 10 is a flowchart illustrating a method for manufacturing a self-powered sensor according to an embodiment of the disclosure.

A manufacturing device (not shown) grows a layer with a preset energy band gap (S1010). Since the layers of each layer group have different lattice structures, the layers are grown separately.

The manufacturing device (not shown) grows a connector on the grown layer (S1020).

The manufacturing device (not shown) alternately grows a plurality of layers and connectors (S1030). The manufacturing device (not shown) alternately grows the plurality of layers and connectors by repeating the above-described steps S1010 and S1020.

The manufacturing device (not shown) bonds the plurality of grown layers and connectors (S1040). The manufacturing device (not shown) bonds the first group of layers (including the connectors) and the second group of layers (including the connectors) which have been separately grown.

The manufacturing device (not shown) etches the layers and connectors so that a portion of the connector grown on each layer is exposed (S1050).

The manufacturing device (not shown) forms one or more electrodes on the exposed portion of each connector (S1060). For example, one electrode may be disposed on each connector between the first group of layers to supply power to the connector, and two electrodes may be disposed on each connector between the second group of layers to supply power to the connector and to transfer electric energy generated from the layer to the storage battery.

Although FIG. 10 illustrates that the steps are sequentially performed, this merely provides an embodiment of the disclosure. It would readily be appreciated by a skilled artisan that the steps of FIG. 10 are not limited to the order shown but may rather be performed in a different order, one or more of the steps may simultaneously be performed, or other various modifications or changes may be made thereto without departing from the scope of the disclosure The steps or processes described above in connection with FIG. 10 may be implemented as computer-readable code in a recording medium. The computer-readable recording medium includes all types of recording devices storing data readable by a computer system. The computer-readable recording medium includes a storage medium, such as a magnetic storage medium (e.g., a ROM, a floppy disk, or a hard disk) or an optical reading medium (e.g., a CD-ROM or a DVD). Further, the computer-readable recording medium may be distributed to computer systems connected via a network, and computer-readable codes may be stored and executed in a distributed manner.

The above-described embodiments are merely examples, and it will be appreciated by one of ordinary skill in the art various changes may be made thereto without departing from the scope of the present invention. Accordingly, the embodiments set forth herein are provided for illustrative purposes, but not to limit the scope of the present invention, and should be appreciated that the scope of the present invention is not limited by the embodiments. The scope of the present invention should be construed by the following claims, and all technical spirits within equivalents thereof should be interpreted to belong to the scope of the present invention.

What is claimed is:

1. A self-powered sensor, comprising:
    at least one first layer emitting light in a preset wavelength band by receiving power from an outside, and receiving the emitted light reflected by an object;
    at least one second layer receiving light and generating a current; and
    a plurality of connectors each grown between two adjacent ones of the at least one first layer and the at least one second layer, the plurality of connectors transferring the generated current to the outside or transferring the power received from the outside to the at least one first layer and the at least one second layer,
    wherein the first layer and the second layer are arranged in descending order of energy band gap in a direction of incident light.

2. The self-powered sensor of claim 1, wherein the preset wavelength band is an infrared wavelength band.

3. The self-powered sensor of claim 1, wherein the plurality of connectors transmit incident light.

4. The self-powered sensor of claim 1, wherein the at least one first layer emits the light in different wavelength bands.

5. A self-powered sensor, comprising:
    at least one first layer emitting light in a mid-infrared wavelength band by receiving power from an outside, and receiving the emitted light reflected by an object;
    at least one second layer formed on the at least one first layer, emitting light in a near-infrared wavelength band by receiving power from the outside, and receiving the emitted light reflected by the object;
    at least one third layer formed on the at least one second layer and receiving light and generating a current; and
    a plurality of connectors each grown between two adjacent ones of the at least one first layer, the at least one second layer, and the at least one third layer, the plurality of connectors transferring the generated current to the outside or transferring the power received from the outside to the at least one first layer, the at least one second layer, and the at least one third layer,
    wherein the first layer, the second layer, and the third layer are arranged in descending order of energy band gap in a direction of incident light.

6. The self-powered sensor of claim 5, wherein the plurality of connectors transmit incident light.

7. The self-powered sensor of claim 5, wherein the at least one first layer or the at least one second layer emits the light in different wavelength bands.

8. A method for manufacturing a self-powered sensor, the method comprising:
    a first growth step of growing a first layer, a second layer, and a third layer, the first layer emitting light in a mid-infrared wavelength band by receiving power from an outside, and receiving the emitted light reflected by an object, the second layer emitting light in a near-infrared wavelength band by receiving power from the outside, and receiving the emitted light reflected by the object, and the third layer receiving light and generating a current;
    a second growth step of growing a connector on each of the first layer, the second layer, and the third layer; and
    a repeating step of repeating the first growing step and the second growing step multiple times,
    wherein the first layer, the second layer, and the third layer are arranged in descending order of energy band gap in a direction of incident light.

9. The method of claim 8, wherein the first layer, the second layer and the third layer are grown on different substrates.

10. The method of claim 8, wherein the third layer and the connector grown on the third layer are bonded with the second layer and the connector grown on the second layer, and the second layer and the connector grown on the second layer are bonded with the first layer and the connector grown on the first layer.

* * * * *